United States Patent [19]

Goudy, Jr. et al.

[11] Patent Number: 4,676,403
[45] Date of Patent: Jun. 30, 1987

[54] METHOD AND CIRCUIT FOR TIMING CHEMICAL DISPENSER OPERATION

[75] Inventors: Paul R. Goudy, Jr., Shorewood; James R. Voigt, Cleveland; Ronald E. Newman, Cedarburg, all of Wis.

[73] Assignee: Autotrol Corporation, Milwaukee, Wis.

[21] Appl. No.: 873,880

[22] Filed: Jun. 13, 1986

Related U.S. Application Data

[63] Continuation of Ser. No. 655,878, Sep. 28, 1984, abandoned.

[51] Int. Cl.$^4$ ............................................. B67D 5/08
[52] U.S. Cl. ....................................... 222/54; 222/1; 222/642; 222/644; 377/20; 328/129.1
[58] Field of Search ............... 222/1, 641, 642, 643, 222/644–646, 52, 54; 221/1, 9, 13, 15; 377/16, 20, 6; 328/129.1; 137/624.13–624.15

[56] References Cited

U.S. PATENT DOCUMENTS

| | | | |
|---|---|---|---|
| 2,602,110 | 7/1952 | Jones | 315/360 |
| 3,721,908 | 3/1973 | Jurjans | 377/16 |
| 3,785,525 | 1/1974 | Handeland | 221/15 |
| 4,056,470 | 11/1977 | Carpenter | 222/638 |
| 4,198,574 | 4/1980 | Price et al. | 315/360 |
| 4,202,387 | 5/1980 | Upton | 222/54 |
| 4,331,262 | 5/1982 | Snyder et al. | 222/644 |
| 4,437,595 | 3/1984 | Stevens et al. | 222/644 |

FOREIGN PATENT DOCUMENTS 2013049  8/1979  United Kingdom ............... 315/360

Primary Examiner—H. Grant Skaggs
Attorney, Agent, or Firm—Quarles & Brady

[57] ABSTRACT

In a method and a circuit for controlling an amount of pelletized material that is dispensed from a pellet dispenser, the dispenser is driven at the same speed during each one of a plurality of pellet dispensing cycles. The frequency of dispenser operation is varied by varying the time interval between pellet dispensing cycles. The circuit includes two timers, an OFF timer which is connected to a counter that counts the number of "off" timing signals in each "off" period and an ON timer that receives a triggering signal from the counter when the "off" period is completed. A switch is connected to the counter to select this number of "off" timing signals. The "off" time period can also be altered by altering the time base of the OFF timer. This is accomplished with a resistance circuit that is connected to a timing circuit for the OFF timer, through either a user-controlled timer or a temperature-responsive switch.

8 Claims, 4 Drawing Figures

METHOD AND CIRCUIT FOR TIMING CHEMICAL DISPENSER OPERATION

This application is a continuation of application Ser. No. 655,878, and filed Sept. 28, 1984, now abandoned.

BACKGROUND OF THE INVENTION

The invention relates to controls for dry chemical dispensers.

Chemical dispensers are used for dispensing pellets, tablets and other forms of dry chemicals into wells and holding tanks. Such a dispenser is shown and described in a copending and concurrently filed application of Goudy et al, entitled, "Bacteriacidal Pellet Dispenser".

Such equipment operates on an intermittent basis to release batches of chemical into the treatment area. When power outages occur, chemical is not dispensed. To retain the effectiveness of chemical treatment, dispensing cycles should be adjustable to increase the amount of chemical dispensed for several hours after a power outage to "catch up" to a daily average of chemical treatment.

The equipment in the above copending application includes a mechanical timer for controlling dispensing cycles. A limitation in the adjustment of this timer is that, due to its mechanical construction, the "on" time for dispenser operation is complementary to the "off" time for the dispenser. If the "on" time for a dispensing cycle is increased, the "off" time between dispensing cycles is decreased by a corresponding amount, making one time dependent on the other. Control over timing cycles is also limited by the resolution available with the mechanical-type adjustment mechanism.

SUMMARY OF THE INVENTION

To control the amount of pelletized material that is dispensed, the invention provides a method in which the pellet dispenser is driven at the same operating speed during each one of a plurality of pellet dispensing cycles. When it is desired to vary the amount of chemical that is dispensed over a treatment period, the frequency of pellet dispensing cycles is varied by varying the "off" time for the dispenser while maintaining an origial "on" time for each pellet dispensing cycle.

The circuit includes a mechanism such as a single-speed motor for driving the pellet dispenser and an electronically controlled switching circuit for turning the motor on and off. A power supply circuit responds to the application of power to generate a first triggering signal to a first timer (the OFF timer), which generates timing signals during the "off" period for the pellet dispenser. A counter receives and relates these timing signals to a second triggering signal according to a user-selected count that determines the duration of the "off" period. This in turn determines the frequency of operation of pellet dispenser over a chemical treatment period. A second timer (the ON timer) responds to the second triggering signal to generate a signal that actuates the switching circuit to cause the driving of the pellet dispenser for the "on" period. The "on" period remains the same, although it occurs at different frequency.

Besides controlling the number of timing cycles in each "off" period, the invention also provides for modifying the time base for such timing signals. This is accomplished by connecting additional resistance to a timing network that determines the time for each cycle within the "off" period. The connection of this added resistance can be controlled either by a user-controlled timer or by a temperature-responsive switch to alter the time base for the OFF timer in response to conditions calling for additional dispensing of chemical.

One object of the invention is to provide a timing control for a pellet dispenser in which the cycle time for the ON timer is independent of the cycle time for the OFF timer.

Another object of the invention is to provide an electronic circuit that is low cost and provides greater precision of control than its mechanical predecessor.

Another object of the invention is to provide a circuit for use with a single operating speed motor for the pellet dispenser. The use of this type of motor further contributes to cost reduction of the system.

Another object of the invention is to provide a circuit operated from power supplies providing an AC frequency of either 60 Hz or 50 Hz.

The foregoing and other objects and advantages of the invention will appear from the following description, in which reference is made to the accompanying drawings that form a part hereof, and in which they are shown by way of illustration a preferred embodiment of the invention. This embodiment, however, does not necessarily represent the full scope of the invention but is merely illustrative, and reference be made to the claims at the end of the description for determining the scope of the invention

DETAILED DESCRIPTION OF THE PREFERRED EMBODIMENT

Figure 1:
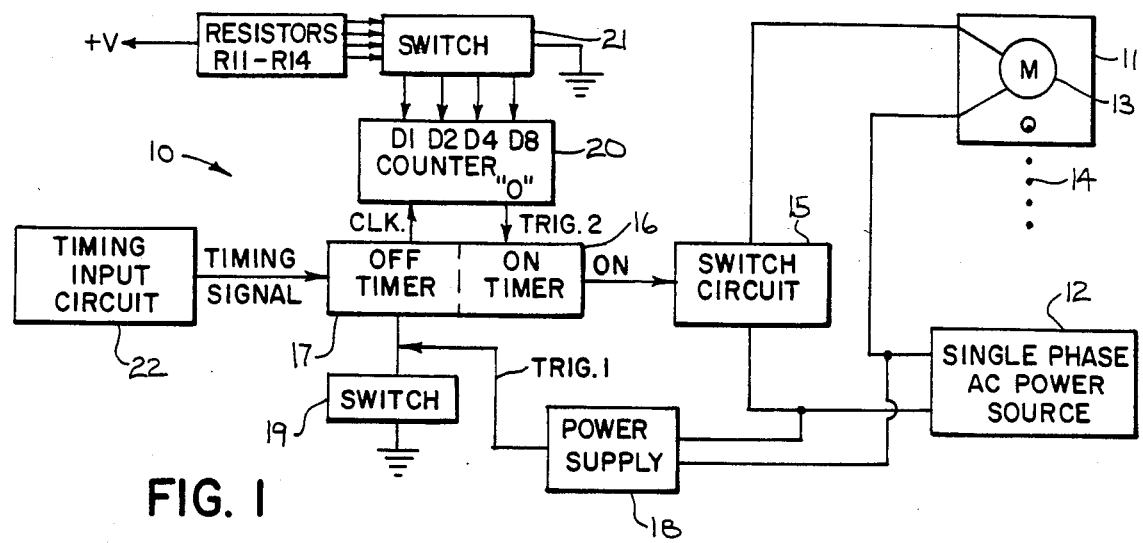
FIG. 1 is a block diagram of a control circuit for a chemical pellet dispenser that embodies the method and apparatus of the invention.

The invention is carried out with a control circuit 10 represented generally in FIG. 1 and connected to a pellet dispenser 11 and to a single-phase AC power source 12. The pellet dispenser 11 is driven by a reversing, single-speed rotary motor 13 which is operated to open a chute to dispense a number of pellets 14 of a dry chemical. Because the motor 13 is operated at the same speed each time, the number of pellets 14 that are dispensed depends upon the length of each dispensing cycle and the frequency such cycles, over a period of chemical treatment. If the motor were instead driven at a different speed each time, different numbers of pellets 14 could be dispensed for similar dispensing cycle times, but that is not the case here. The connection of the motor 13 to the single-phase AC power source 12 is controlled by an electronic switching circuit 15 which receives an ON or actuating signal from an ON timer 16. The ON timer is part of an integrated circuit that also includes an OFF timer 17.

The OFF timer 17 in FIG. 1 is triggered to begin its timing function by a TRIG.1 triggering signal originating from a power supply circuit 18. The power supply circuit 18 receives power from the AC power source 12 and provides a low-level AC signal at power line frequency on the TRIG. 1 line. A solid state switch 19 is connected between the trigger input on the OFF timer 17 and ground. When the AC trigger signal exceed a relatively low threshold, e.g. about eight volts, the solid state switch 19 conducts to generate a logic low triggering input signal. This signal is generated for each cycle of the power line frequency, which may be 60 Hz or 50 Hz. After the first triggering signal at power line frequency, successive signals will not retrigger the OFF timer 17, because it is connected for operation in a non-retriggerable mode.

The OFF timer 17 generates timing or clock (CLK) signals to a binary counter 20. Inputs D1, D2, D4 and D8 on the binary counter 20 are connected through a multi-circuit switch 21 and four respective resistors R11-R14 to a source of the logic high (+V) signal. The switch setting determines which of the inputs D1, D2, D4 and D8 receive logic high input signals and which receive logic low signals. According to these signals, the counter 20 will count a certain number of clock (CLK) signals from the OFF timer 17 and then generate a second triggering signal (TRIG.2) to the ON timer 16. This signal will cause the ON timer 16 to generate the actuating or ON signal to the switch circuit 15 to begin a pellet dispensing cycle. When the ON timer "times out", after a typical timing period of two minutes, the ON signal is removed, the switching circuit 15 is deactivated and the motor 13 is turned off. Also seen in FIG. 1 is a timing input circuit 22 for varying the time base or period between generation of clock (CLK) signals from the OFF timer 17.

The above-described circuit provides independent timing of "on" and "off" periods. The "on" period is provided by the ON timer over a single period of timing, while the "off" period is provided by a multiple number of timing cycles of the OFF timer as determined by the counter 20 and its associated inputs. Next, further aspects of the various circuits shown in FIG. 1 will be discussed in relation FIGS. 2, 3 and 4.

Figure 2:
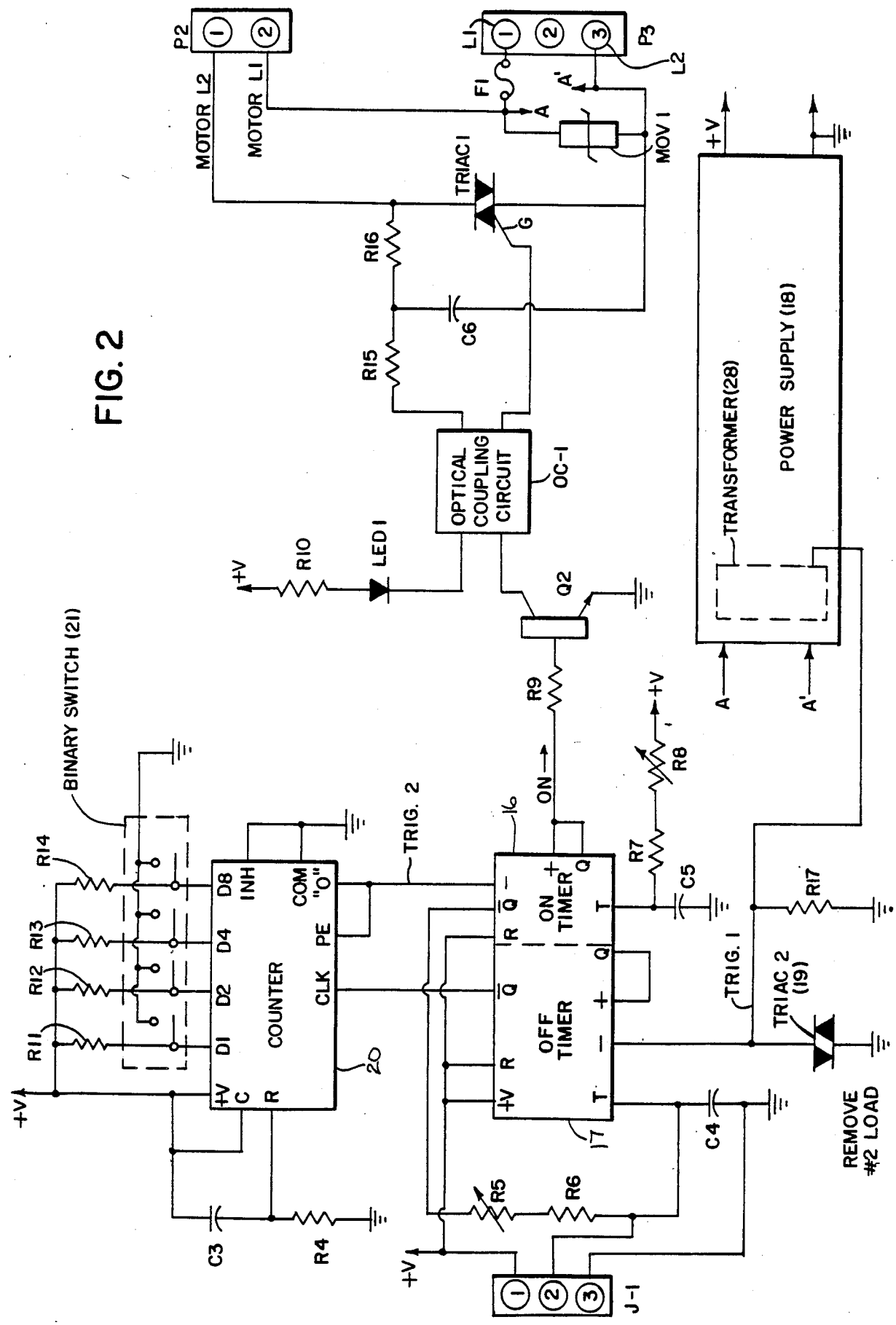

Referring then to FIG. 2, the power source 12 is connected through power lines L1 and L2 to connector P3. Power line L1 is then connected through fuse F1 to motor line L1 and connector P2, and to the power supply 18 through line A. Power line L2 is connected to the power supply 18 through line A' and through TRIAC 1 and motor line L2 to connector P2. TRIAC 1 controls application of AC line voltage across the motor terminals. Varistor MOV 1 is connected across power lines L1 and L2 to suppress power line transients.

The switching of TRIAC 1 is controlled at a gate input G, which is connected to one output of an optical coupling circuit OC-1. Current flows through this output when a light detector within the optical coupling circuit OC-1 detects light from a light-emitter within the optical coupling circuit OC-1. The other output of the optical coupling circuit OC-1 is connected through resistors R15 and R16 in a T-network to motor line L2 and one side of TRIAC 1. A capacitor C6 is connected between a junction in between resistors R15 and R16 and the other side of the TRIAC 1. The values of the resistors R15, R16 and capacitor C6 are selected to reduce the sensitivity of TRIAC 1 to transients that could cause premature switching of TRIAC 1.

On the input side, the light emitting diode internal to the optical coupling circuit OC-1 has an anode connected through an external light-emitting diode (LED 1) and resistor R10 to the high side of the power supply 18, which provides a DC logic high voltage (+V) of approximately +10 DC volts. The cathode of the internal light-emitting diode is connected to the collector of an NPN transistor Q2. The emitter of transistor Q2 is connected to ground and the base is connected through resistor R9 to the Q output of the ON timer 16.

When the ON signal, which is a logic high signal, is transmitted through resistor R9, a voltage across the base-emitter junction causes transistor Q2 to conduct, which in turn causes optical coupling circuit O-1 to conduct on its output side to provide a gating signal to TRIAC 1 that turns on the motor 13. When the Q output of the ON timer 16 is switched low, transistor Q2 will stop conduction, current will no longer be conducted from the output side of the optical coupling circuit OC-1, the TRIAC 1 gate signal is removed, and the TRIAC 1 will turn off during the next negative half-cycle of line voltage.

Also seen in FIG. 2 are the connections of the inputs and outputs on the ON and OFF timers 16 and 17. These timers 16 and 17 are provided by a 4538B dual multivibrator, CMOS-technology integrated circuit available from Motorola Semiconductor, Phoenix, Arizona, and National Semiconductor, Santa Clara, California. Each timer 16, 17 is provided by one of the multivibrators in this integrated circuit. In the typical operation of a multivibrator, an edge of a triggering pulse causes the Q output to go high for a timing period determined by the values of resistors and capacitors connected to timing inputs. At the end of this timing period, the Q output will switch back to a logic low state. A multivibrator typically has one input (+) for receiving a logic high triggering signal and another input (−) for receiving an alternative, logic low triggering signal. It also has a second output $\overline{Q}$, which generates a signal of opposite logic state to the Q output.

Looking then at the particular arrangement in FIG. 2, the logic low trigger input (−) on the OFF timer is connected to a TRIAC 2 which conducts when a rather low breakdown voltage is applied across its anodes through resistor R17. The gate input on TRIAC 2 is not used. The signal applied to TRIAC 2 is the TRIG. 1 signal, which originates from a secondary winding of a transformer 28 in the power supply 18. This signal is plotted against time in FIG. 4, graph 2. It rises along a sinusoidal path until a threshold voltage of approximately +8 volts is reached. The conduction of TRIAC 2 causes the TRIG. 1 signal to drop to zero. This generates a logic low signal from the $\overline{Q}$ output of the OFF timer 17 which is seen as the falling edge of the pulses in FIG. 4, graph 3.

For the middle three $\overline{Q}$ output pulses the falling edge corresponds to the falling edge of a corresponding TRIG. 1 signal. The $\overline{Q}$ output signal then remains low for a typical "off" timing period (T-1) of two minutes. When the timer "times out", the $\overline{Q}$ output goes high and, on the next TRIG. 1 pulse, goes low to form the narrow pulse waveforms seen in FIG. 4, graph 3.

The two-minute "off" timing period is determined by the setting of variable resistor R5, and the values of fixed resistor R6 and capacitor C4, which are included in a timing circuit in FIG. 2. Capacitor C4 is connected between timing input T and ground, while resistors R5 and R6 are connected to the $\overline{Q}$ output of the ON timer. The capacitor C4 charges to perform the timing function when the $\overline{Q}$ output of the ON timer is at a logic high voltage. When the $\overline{Q}$ output of the ON timer is at a logic low voltage timing for the OFF timer 17 is inhibited.

Referring again to FIG. 4, when the ON signal is transmitted from the Q output of the ON timer (graph 5) and the TRIAC 1 is "on" (graph 6), the timing of the logic low signal at the Q output of the OFF timer 17 is inhibited. When the ON signal is terminated, the inhibit is ended and the OFF timer 17 times out in the next two-minute interval.

Referring to FIG. 2, the Q output of the OFF timer 17 is connected to the logic high (+) trigger input to place the OFF timer 17 in a non-retriggerable mode. In a retriggerable mode, receiving a second pulse on the TRIG. 1 line would restart the timing period. As it is desirable to use the OFF timer 17 to time a constant cycle time for each output pulse from the OFF timer, the non-retriggerable mode is selected.

The ON timer 16 also has its Q output connected to its logic high (+) trigger input for operation in the non-retriggerable mode. The timing terminal T2 on the ON timer 16 is connected to a junction between resistors R7 and R8 and capacitor C5. Variable resistor R8 is connected to the high side (+V) of the DC portion of the power supply 18, while the negative plate of capacitor C5 is connected to ground. The values of these components are selected to provide an "on" time such as two minutes. When a signal is received at the logic low (−) triggering input of the ON timer 16, a logic high signal is transmitted from the output and maintained for the "on" period of two minutes. The ON timer 16 then times out and the OFF period is started by a triggering signal from the power supply circuit 18.

Multiple cycles of the OFF timer 17 are used to time an OFF period that is longer than the ON period of dispenser operation. To do this, the $\overline{Q}$ output of the OFF timer 17 is connected to a clock (CLK) input on the counter 20. When the OFF timer is triggered, the $\overline{Q}$ output generates a logic low signal and when the OFF timer "times out", the $\overline{Q}$ output switches back to a logic high signal. On this transition the counter is decremented one count.

The counter 20 is preferably a 4526B binary divide-by-N counter, which is CMOS-technology circuit available from Motorola Semiconductor, Phoenix, Arizona, and National Semiconductor, Santa Clara, California. The counter 20 is operated in a count-down mode by connecting its INH (inhibit) input to ground. In this mode, it counts down from a number appearing at its inputs D1, D2, D4 and D8 until reaching zero. When zero is reached, it transmits a logic high signal from its "0" output to a preset enable (PE) input in FIG. 2. This loads the binary number at inputs D1, D2, D4 and D8 into the counter and the "0" output then goes low as shown by the trailing edge of the positive pulses in FIG. 4, graph 4. This generates a trigger signal to the logic low (−) triggering input of the ON timer 16, which in turn produces the ON signal and the gating of TRIAC 1 as represented in graphs 5 and 6 of FIG. 4.

The number of CLK signals to the counter 20 that are required to generate the TRIG.2 signal to the ON timer 16 is preset using the binary switch 21 seen in FIG. 2. The switch 21 is a linear action DIP switch in which a slidable member is set to one of sixteen input positions that is decoded to generate one or more signals at binary coded outputs connected to the binary inputs on the counter 20. In this embodiment, numbers "1" to "16" (not shown) on the DIP switch 21 have been chosen to represent relative amounts of chemical dispensed from the dispenser 11. The highest number on the switch 21 is to represent the dispensing of the largest amount of chemical, which requires the greatest "on" time and least "off" time. Conversely, the lowest number on the switch 21 is to select the greatest "off" period corresponding to the dispensing of the least chemical. As an example of switch operation, if the number "13" is selected with the binary switch 21, the number "3" will appear at the counter inputs. As soon as three clock (CLK) pulses (FIG. 4, graph 3) are received from the OFF timer 17, a triggering signal will be generated from the "0" output of the counter 20 to the logic low (−) trigger input on the ON timer 16.

To carry out this complementary mode of operation for the binary switch 21, the inputs D1, D2, D4 and D8 on the counter 20 are pulled up to a logic high (+V) through resistors R11-R14, unless one of the circuits in the switch 21 is closed to ground an input. If the switch 21 is set to "1" its circuits are all open, the signals at input D1-D8 will be "1111" and the counter will count the longest "off" timing period for the dispenser 11. When the circuits are all closed, the signals at inputs D1-D8 will be "0000". With this setting, a train of pulses of the type seen in FIG. 4, graph 3, will be generated as the counter counts zero, loads the present number "0", and counts zero again. This provides continuous triggering of the ON timer for a continuous "on" mode of dispenser operation, and the largest amount of chemical is dispensed in this mode.

Figure 4:
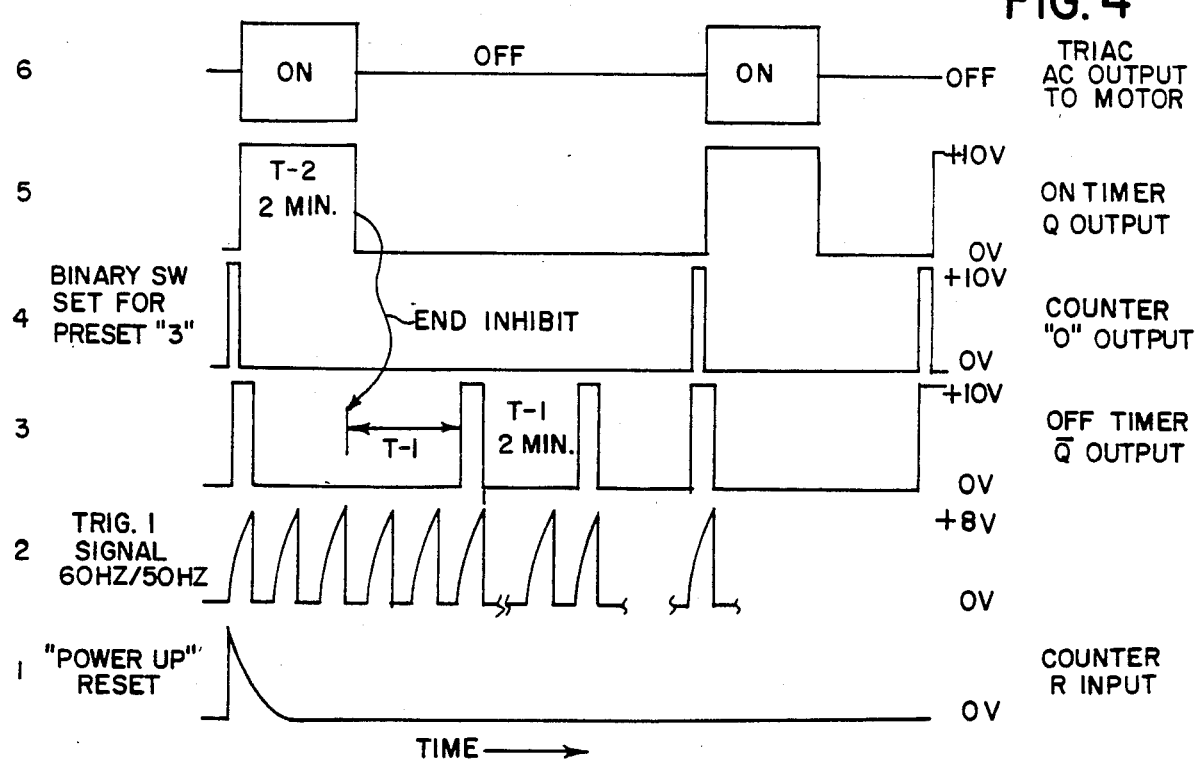
FIG. 4 is a timing diagram showing the signals generated by the circuitry in FIG. 2.

Also seen in FIG. 2 is a "power up" reset circuit for the counter 20. A capacitor C3 is connected between the high side of the DC supply 18 and a reset (R) input on the counter. A resistor R4 is connected from the reset (R) input to ground. When power is applied, the primary portion of the voltage is seen across capacitor R4, but as the capacitor C4 charges this voltage rapidly falls off so that first a logic high and then a logic low is applied to the reset input on the counter 20. This pulse is seen in FIG. 4, graph 1.

In the control circuit described thus far, the "off" period of the dispenser 11 has been controlled by selecting the number of OFF cycles from the OFF timer that define the "off" period. The length of the "off" period determines the frequency of two-minute "on" periods for the dispenser 11. A constant OFF cycle of two minute has been assumed for the OFF timer based on selected values of R5, R6, and C4. If, however, the total resistance connected between the logic high voltage (+V) and the T input to the OFF timer is changed, by connecting other circuitry through connector J-1, the time base for the OFF timing cycles can be varied to vary the frequency of dispenser operation. This is accomplished with the timing input circuit 22 of FIG. 1, which is seen in more detail in FIG. 3.

Figure 3:
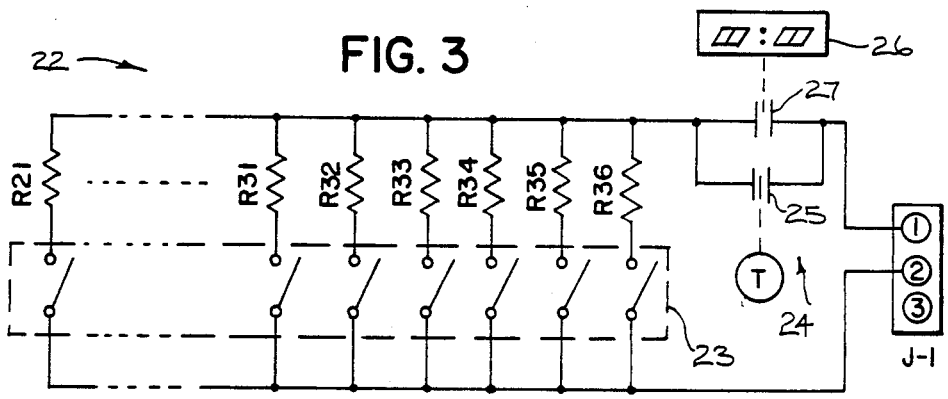
FIGS. 2 and 3 are detailed electrical schematic diagrams of the control circuit of FIG. 1.

As seen in FIG. 3, a group of sixteen resistors R21-R36 are connected in parallel through a 1-of-16 circuit DIP switch 23. The resistors have different values, and when one of them is connected in parallel through connector J-1 to resistors R5 and R6 in FIG. 2, the charging time of capacitor C4 and the timing cycle for OFF timer signals are altered. The connection of one of the resistors R21 $\propto$ R36 to alter the timing of the OFF timer 17 occurs when various conditions are sensed.

For example, if the dispenser is dispensing chlorine for a cooling tower, the evaporation of the chlorinated liquid increases at higher temperature and requires a higher rate of chlorine treatment. For this process a temperature-responsive switch 24 can be set to close a pair of contacts 25 seen in FIG. 3 when temperature at the dispenser exceeds 25°C.

As another example, after a power outage, maintenance personnel may want to increase the rate of chemical treatment over a period of several hours. To do this a digital, time-of-day timer 26 is set to close a pair of contacts in FIG. 3 to connect the selected resistor R21–R36 to the timing circuit for the OFF timer 17. The digital timer 26 holds the contacts 27 closed for several hours until it reaches an "off" time of day when it will open the contacts 27 to resume the normal treatment rate. From these examples, it should be apparent that the treatment rate can be changed manually or automatically in response to many types of conditions.

The details that have been given herein are by way of the disclosure required by law. Such details may be varied in other embodiments of the invention without exceeding its scope. Therefore, to apprise the public of the scope of the invention, the following claims are made.

We claim:

1. A method for providing a constant rate at which dry chemical material is dispensed from a chemical dispenser, the method comprising:
   driving the chemical dispenser at the same speed and for the same time during each one of a plurality of dispensing cycles during a treatment period;
   counting a preset number of electrical timing signals that define a first off cycle for the dispenser, and upon reaching the present number, generating a signal to drive the dispenser through a first dispensing cycle;
   in response to completion of the first dispensing cycle, counting the present number of electrical timing signals a second time to define a second off cycle for the dispenser of like duration to the first off cycle, and upon reaching the preset number, generating a signal to drive the dispenser through a second dispensing cycle; and
   varying the duration of off cycles from one treatment period to another treatment period by varying the time interval over which the electrical timing signals are counted for each one of the first and second off cycles.

2. The method of claim 1, wherein the duration of off cycles is varied by selecting a different present number of electrical timing signals that are counted to measure each one of the first and second off cycles.

3. The method of claim 1, wherein the duration of off cycles is varied by varying the time base associated with the preset number of electrical timing signals that are counted to measure each one of the first and second off cycles.

4. Apparatus for selecting one of a plurality of constant rates at which dry chemical is emitted from a dispenser over a treatment period that includes a plurality of dispensing cycles, the apparatus comprising:
   drive means for driving the dispenser at the same speed during each dispensing cycle;
   switch means for turning the drive means on and off;
   means for generating first triggering signals;
   first timer means responsive to the first triggering signals to generate sequences of first timing signals during respective "off" periods for the dispenser;
   counter means for receiving and relating the sequences of first timing signals to respective second triggering signals according to a user-selected count that determines the duration of each "off" period and a selected constant rate of dispensing cycles;
   second timer means responsive to the second triggering signals to generate corresponding second timing signals to the switch means to cause the driving of the dispenser for respective dispensing cycles, the second timer means being further responsive at the end of each dispensing cycle to signal the first timer means to start generating a next sequence of first timing signals for a next "off" period.

5. The apparatus of claim 4, further comprising:
   first switch means coupled to the counter means to allow a user to change the count that determines the duration of each "off" period of the dispenser.

6. Apparatus for providing two rates at which dry chemical is dispensed from a dispenser during a treatment period that includes a plurality of dispensing cycles, the apparatus comprising:
   drive means for driving the dispenser at the same speed during each dispensing cycle;
   first switch means for turning the drive means on and off;
   means for generating first triggering signals;
   first timer means responsive to the first triggering signals to generate squences of first timing signals during respective "off" periods for the dispenser,
   wherein the first timer means includes an RC timing circuit that controls a timing period between first timing signals;
   counter means for receiving and relating sequences of first timing signals to respective second triggering signals according to a user-selected count that determines the duration of each "off" period and a rate for the plurality of dispensing cycles;
   second timer means responsive to the second triggering signals to generate corresponding second timing signals to the switch means to cause the driving of the dispenser for respective dispensing cycles;
   resistance means;
   second switch means for connection of the resistance means in the RC timing circuit of the first timing means; and
   means for actuating the second switch means to change the timing period provided by the RC timing circuit and to change from a first rate for the plurality of dispensing cycles to a second rate for the plurality of dispensing cycles, said means deactuating the second switch means after an interval within the treatment period to resume the first rate for the plurality of dispensing cycles.

7. The apparatus of claim 6, wherein the means for actuating the second switch means to change from the first rate to the second rate is a third timer means for deactuating the second switch means after a timed interval to resume the first rate for the plurality of dispensing cycles.

8. The apparatus of claim 6, wherein the means for actuating the second switch means to change from the first rate to the second rate is a temperature responsive means for actuating the second switch means at a predetermined temperature threshold.

* * * * *

UNITED STATES PATENT AND TRADEMARK OFFICE
CERTIFICATE OF CORRECTION

PATENT NO. : 4,676,403

DATED : June 30, 1987

INVENTOR(S) : Goudy, Jr. et al.

It is certified that error appears in the above-identified patent and that said Letters Patent is hereby corrected as shown below:

Column 1, line 45, "origianl" should be --original--.

Column 2, line 11, "low cost" should be --low in cost--.

Column 4, line 6, "0-1" should be --OC-1--.

Column 5, line 1, "Q" should be --$\overline{Q}$--.

Column 6, line 20, "present" should be --preset--.

Column 6, line 41, "minute" should be --minutes--.

Column 6, line 57, "oc" should be -- - --.

Column 7, line 26, "present" should be --preset--.

Column 7, line 30, "present" should be --preset--.

Column 7, line 42, "present" should be --preset--.

Column 8, line 14, second "of" should be --for--.

UNITED STATES PATENT AND TRADEMARK OFFICE
CERTIFICATE OF CORRECTION

PATENT NO. : 4,676,403

DATED : June 30, 1987

INVENTOR(S) : Goudy, Jr. et al

It is certified that error appears in the above-identified patent and that said Letters Patent is hereby corrected as shown below:

Column 8, line 26, "squences" should be --sequences--.

Signed and Sealed this

First Day of March, 1988

Attest:

DONALD J. QUIGG

Attesting Officer

Commissioner of Patents and Trademarks